United States Patent
Song et al.

(10) Patent No.: US 9,564,329 B2
(45) Date of Patent: Feb. 7, 2017

(54) METHOD AND APPARATUS FOR FABRICATING DIELECTRIC STRUCTURES

(71) Applicant: Aixtron, Inc., Sunnyville, CA (US)

(72) Inventors: Kay Song, San Jose, CA (US); Minghang Li, San Jose, CA (US); Brian Lu, Fremont, CA (US)

(73) Assignee: AIXTRON, SE, Herzogenrath (DE)

( * ) Notice: Subject to any disclaimer, the term of this patent is extended or adjusted under 35 U.S.C. 154(b) by 0 days.

(21) Appl. No.: 14/553,436

(22) Filed: Nov. 25, 2014

(65) Prior Publication Data

US 2015/0155157 A1 Jun. 4, 2015

Related U.S. Application Data

(60) Provisional application No. 61/910,383, filed on Dec. 1, 2013.

(51) Int. Cl.
| | |
|---|---|
| *H01L 21/02* | (2006.01) |
| *H01L 21/28* | (2006.01) |
| *C23C 16/40* | (2006.01) |
| *C23C 16/455* | (2006.01) |
| *H01L 29/51* | (2006.01) |

(52) U.S. Cl.
CPC ....... *H01L 21/28194* (2013.01); *C23C 16/402* (2013.01); *C23C 16/405* (2013.01); *C23C 16/45529* (2013.01); *H01L 21/022* (2013.01); *H01L 21/0228* (2013.01); *H01L 21/02164* (2013.01); *H01L 21/02178* (2013.01); *H01L 21/02181* (2013.01); *H01L 21/02189* (2013.01); *H01L 21/02194* (2013.01); *H01L 21/02321* (2013.01); *H01L 29/513* (2013.01); *H01L 29/517* (2013.01)

(58) Field of Classification Search
CPC .................. H01L 21/02181; H01L 21/02189; H01L 21/02194; H01L 21/02321
See application file for complete search history.

(56) References Cited

U.S. PATENT DOCUMENTS

| | | | |
|---|---|---|---|
| 6,548,424 B2 * | 4/2003 | Putkonen | C23C 16/405 257/E21.274 |
| 7,754,618 B2 | 7/2010 | Ahn et al. | |
| 7,833,913 B2 | 11/2010 | Clark | |
| 7,833,914 B2 | 11/2010 | Ahn et al. | |
| 2002/0042165 A1 * | 4/2002 | Putkonen | C23C 16/405 438/142 |
| 2004/0043557 A1 * | 3/2004 | Haukka | C23C 16/40 438/240 |
| 2004/0245602 A1 * | 12/2004 | Kim | H01L 21/31645 257/532 |

(Continued)

*Primary Examiner* — Joseph C Nicely
(74) *Attorney, Agent, or Firm* — Ascenda Law Group, PC (57) ABSTRACT

A composite dielectric structure having one or more Leakage Blocking Layers (LBL) interleaved with one or more Laminate Dielectric Layers (LDL), Alloy Dielectric Layers (ADL), or Co-deposit Dielectric Layers (CDL). Each LDL, ADL, and CDL includes dopants incorporated in a respective base dielectric layer (BDL); where LDLs are formed by incorporating a doping layer into a BDL using a laminate method, ADLs are formed by incorporating a dopant into a BDL using an alloying method; and CDLs are formed by pulsing a BDL base material and a dopant together using a co-deposit method.

18 Claims, 4 Drawing Sheets

(56) References Cited

U.S. PATENT DOCUMENTS

| | | | |
|---|---|---|---|
| 2005/0239298 A1* | 10/2005 | Damlencourt | C23C 16/14 438/785 |
| 2008/0122044 A1* | 5/2008 | Kang | C23C 16/405 257/637 |
| 2008/0233288 A1* | 9/2008 | Clark | C23C 16/308 427/255.394 |
| 2009/0189235 A1* | 7/2009 | Ikeda | H01L 27/1461 257/432 |
| 2010/0091428 A1* | 4/2010 | Kim | H01L 23/53214 361/313 |
| 2010/0164064 A1* | 7/2010 | Kim | H01L 21/02181 257/532 |
| 2011/0014770 A1* | 1/2011 | Park | C23C 16/45531 438/381 |
| 2012/0082283 A1* | 4/2012 | Popa-Simil | G01T 1/204 376/245 |
| 2012/0127629 A1 | 5/2012 | Roeder et al. | |
| 2012/0181660 A1* | 7/2012 | Fujiwara | H01L 27/10852 257/532 |
| 2013/0143379 A1* | 6/2013 | Malhotra | H01L 28/40 438/381 |
| 2013/0200491 A1* | 8/2013 | Wamura | H01L 28/60 257/532 |
| 2015/0035085 A1* | 2/2015 | Ahmed | H01L 21/02181 257/410 |

* cited by examiner

CHART
A

CHART
B

CHART
C

CHART
D

METHOD AND APPARATUS FOR FABRICATING DIELECTRIC STRUCTURES

RELATED APPLICATIONS

This is a NONPROVISIONAL of, claims priority to and incorporates by reference U.S. Provisional Application No. 61/910,383, filed 1 Dec. 2013.

FIELD OF THE INVENTION

The present invention relates to methods and systems for fabricating a dielectric composite structure for semiconductor devices, which composite structure provides a high effective dielectric constant while preserving desired properties such as low leakage current, high breakdown voltage, and good step coverage.

BACKGROUND

In semiconductor manufacturing processes for devices beyond the 30 nm node, high dielectric constant (so-called "high-k") materials are needed to meet performance requirements for high capacitance, low leakage, and low power consumption. High-k films are typically used to form capacitor dielectrics in Dynamic Random Access Memory (DRAM) devices, gate insulator layers in Metal Oxide Semiconductor Field Effect Transistors (MOSFETs) or tunnel gate dielectrics in flash memory circuits, among other applications.

Hafnium oxide ($HfO_2$) and zirconium oxide ($ZrO_2$) are widely used high-k materials and offer higher dielectric constants than those of $SiO_2$ and $Al_2O_3$, wide band gaps, high refractive indices, and good thermal stability. To further increase the dielectric constant of oxide materials, implantation of doping materials into $HfO_2$ and $ZrO_2$ have been explored, but the challenge remains of how to increase the k value, while maintaining low leakage current and high breakdown voltage.

A method of forming an apparatus having a dielectric containing cerium oxide and aluminum oxide is described in U.S. Pat. No. 7,754,618. Methods of forming crystallographically stabilized doped hafnium zirconium-based films are described in U.S. Pat. No. 7,833,913. U.S. Pre-grant publication 2012/0127629 describes a doped $ZrO_2$ capacitor.

SUMMARY

In one embodiment, the present invention provides a composite dielectric structure having one or more Leakage Blocking Layers (LBL) interleaved with one or more Laminate Dielectric Layers (LDL), Alloy Dielectric Layers (ADL), or Co-deposit Dielectric Layers (CDL). Each LDL, ADL, and CDL includes dopants incorporated in a respective base dielectric layer (BDL); where LDLs are formed by incorporating doping layer into a BDL using a laminate method, ADLs are formed by incorporating a dopant into a BDL using an alloying method; and CDLs are formed by pulsing a BDL base material and a dopant together using a co-deposit method. The LDL/ADL/CDL layers can have similar or different thickness and doping concentrations. A dopant or doping layer can be incorporated into the BDL at any thickness from 0.5-200 nm and doping concentration ranges from 0.5-50% may be used. The number of LDL/ADL/CDL and LBL layers may be selected to modulate the leakage current while still maintaining the dielectric constant for the structure. The base dielectric materials may include $ZrO_2$, $HfO_2$, and any composite of $ZrO_2/HfO_2$ mixtures. Dopants may include lanthanide metals; group III(B), IV(B) and V(B) metals; as well as oxides of such metals. Leakage blocking materials may include $SiO_2$ and $Al_2O_3$.

Atomic layer deposition (ALD) processes for fabricating composite dielectric structures containing BDL, LDL, ADL, CDL and LBL materials in accordance with embodiments of the present invention may include the combination of doped dielectric depositions (including LDL, ADL or CDL process) and leakage blocking depositions. The combined processes may be designed to form films with desired doping concentrations, stack thicknesses, and electrical performances. BDL thickness may be controlled by the number of cycles of a base dielectric process. Doped layer (LDL, ADL, and CDL) thickness may be controlled by the number of cycles of doped dielectric layer processes. LBL thickness may be controlled by the number of cycles of a leakage blocking layer process. In each ALD process cycle, metal pulse time and flow (for base, doping and blocking precursors) are controllable. In each ALD process cycle, oxidant pulse time and flow are controllable. The deposition temperatures for forming these materials during ALD process may be between 100° C.-500° C., inclusive. A post-deposition processing step to anneal the structure for achieving targeted film properties may be used.

In one example of an ALD process flow for fabricating an oxide BDL, a base metal precursor is pulsed into a chamber of an ALD apparatus with an Argon (or other neutral) carrier gas. After a self-limiting deposition process of base metal precursor on the substrate surface is complete, excess base metal precursor is purged out and an oxidant (Ozone, $O_2$, or $H_2O$) is pulsed into the chamber. Finally, the oxidant is purged out. These steps may be repeated until a desired BDL thickness is obtained.

In one example of an ALD process flow for fabricating a doped dielectric LDL, a doping layer is incorporated into a BDL using a laminating method. The thickness ratio of the doping layer and the BDL ranges from 0 to 50% to obtain the desired doping concentration. The laminating sequence of the doping layer into the BDL is selected to accomplish a desired doping layer with optimal electrical performance. The process sequence of the LDL formation includes pulsing a base metal precursor into a chamber of an ALD apparatus with an Argon (or other neutral) carrier gas. After a self-limiting deposition process of base metal precursor on the substrate surface is complete, excess base metal precursor is purged out and an oxidant (Ozone, $O_2$ or $H_2O$) is pulsed into the chamber. Then, the oxidant is purged out and a dopant precursor is pulsed into the chamber with an Argon (or other neutral) carrier gas. After a self-limiting deposition process of dopant precursor on the substrate surface is complete, excess dopant precursor is purged out, an oxidant (Ozone, $O_2$ or $H_2O$) is pulsed into the chamber, and then the oxidant is purged out of the chamber. These steps may be repeated until a desired LDL thickness is obtained.

In one example of an ALD process flow for fabricating a doped dielectric ADL, an ADL is formed by pulsing (once or multiple times) of a base metal followed by a dopant before the injection of oxidant into the chamber. The thickness ratio of the doped layer and the BDL ranges from 0 to 50% to obtain the desired doping concentration. Doping concentration can also be controlled by the amount of dopant injected during each ALD cycle. The alloying sequence of the dopant into the BDL is selected to accomplish a desired doping layer with optimal electrical performance. One such example of a process for ADL layer formation includes pulsing the base metal precursor into the chamber with Argon (or other neutral) carrier gas. After a self-limiting deposition process of base metal precursor on the substrate surface is complete, excess base metal precursor is purged out and dopant precursor is pulsed into the chamber with Argon (or other neutral) carrier gas. After deposition, the excess dopant precursor is purged out and oxidant (Ozone, $O_2$ or $H_2O$) is pulsed into the chamber. Finally, the oxidant is purged out of the chamber. These steps may be repeated to achieve a desired ADL thickness.

In one example of an ALD process flow for fabricating a doped dielectric CDL, a CDL is formed by injecting base metal and dopant simultaneously before the injection of oxidant into the chamber. Doping concentration may be controlled by varying the ratio of metal and dopant precursors used in the pulses. Doping concentration may also controlled by the thickness ratio of the co-deposited layer and the BDL, ranging from 0-50%. The co-depositing sequence of the metal/dopant into the BDL is selected to accomplish a desired doping layer with optimal electrical performance. An example of a process sequence for CDL formation involves pulsing base metal and dopant precursors into a chamber together with Argon (or other neutral) carrier gas. After a self-limiting deposition processes of mixed base metal and dopant precursors on the substrate surface are complete, excess base metal and dopant precursors are purged out of the chamber and an oxidant (Ozone, $O_2$ or $H_2O$) is pulsed into the chamber. Finally, the oxidant is purged out of the chamber. These steps may be repeated to obtain a desired CDL thickness.

In one example of an ALD process flow for fabricating an oxide LBL, a leakage block precursor is pulsed into the chamber with Argon (or other) carrier gas. After a self-limiting deposition process of leakage blocking precursor on the substrate surface is complete, excess leakage blocking precursor is purged out and an oxidant (Ozone, $O_2$ or $H_2O$) is pulsed into the chamber. Finally, the oxidant is purged out of the chamber. These steps may be repeated to achieve a desired LBL thickness.

The composite dielectric structure of the present invention can be crystallographically stabilized in the tetragonal or/and cubic phases, which have higher dielectric constants upon post-process annealing. The structure can be annealed under inert gases, such as Argon, $N_2$ or forming gas $N_2/H_2$, or other environments. The structure can be annealed at temperatures between 300-900° C., inclusive. The structural can also be photo irradiated by infrared, visible, or ultraviolet light, and/or can be treated by electron and ion irradiation.

These and further embodiments of the invention are described in greater detail below.

BRIEF DESCRIPTION OF THE DRAWINGS

The present invention is illustrated by way of example, and not limitation, in the figures of the accompanying drawings, in which.

The charts shown in FIG. 2 provide examples of improved electrical performance with some designs of composite dielectric structures produced in accordance with the present invention annealed at temperatures between 300 and 900° C.

DETAILED DESCRIPTION

Described herein are methods and systems for fabricating a dielectric composite structure for semiconductor devices, which composite structure provides a high effective dielectric constant while preserving desired properties such as low leakage current, high breakdown voltage, and good step coverage.

In various embodiments, the present invention concerns the architecture of a dielectric composite structure, and the process flow and the equipment design for fabricating such a dielectric structure, having a higher effective dielectric constant than conventional $HfO_2$ and $ZrO_2$ films, and which exhibits other desired properties such as low leakage current, high breakdown voltage, and good step coverage. The present composite structure includes alternating or repeating stacks of one thin layer of material for enhancing capacitance and another thin layer of material for suppressing leakage current. An atomic layer deposition (ALD) method and apparatus for forming the composite structure on a substrate is illustrated, with selected doping layers and leakage blocking layers using various laminate, alloying, and co-deposit strategies. This invention may find application in a number of areas, for example the manufacture of complementary metal oxide semiconductor (CMOS) gate stacks in DRAMs and flash memories, and in other commercial semiconductor devices.

Figure 1:
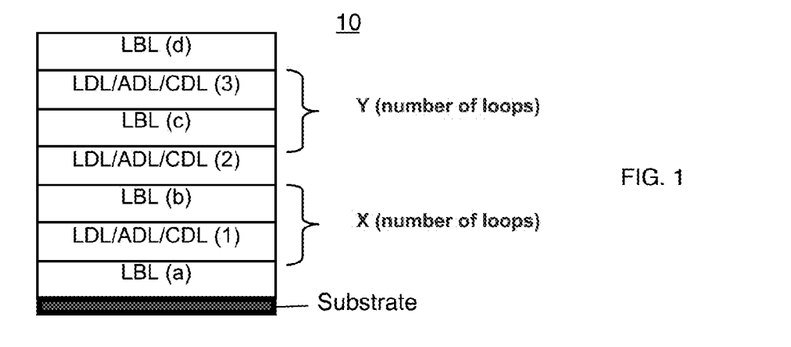
FIG. 1 illustrates one example of a composite dielectric structure configured in accordance with one embodiment of the present invention.

FIG. 1 illustrates one example of a composite dielectric structure 10 configured in accordance with one embodiment of the present invention. As shown, composite dielectric structures formed on a substrate and in accordance with the present invention include alternating or repeating stacks of a doped dielectric layer for increasing capacitance (indicated as an LDL, ADL or CDL layer) and another layer for suppressing/blocking leakage current (indicated as an LBL layer). This composite dielectric structure 10 offers a high dielectric constant (k greater than that of $HfO_2$ and $ZrO_2$) while still maintaining low electrical leakage.

In various embodiments, the composite dielectric structure 10 is formed by building optimal LDL/ADL/CDL and LBL combination stacks using laminate, alloying or co-deposit strategies. For LDL/ADL/CDL materials, a dopant or doping layer can be incorporated into a base dielectric layer (BDL) during any ALD process cycle and at any thickness from 0.5 nm to 200 nm. For LBL materials, layer thickness may range from 0.1 nm to 100 nm. A composite dielectric structure 10 in accordance with the present invention may be symmetric or asymmetric in reference to the layer LDL/ADL/CDL (2) shown in FIG. 1.

A base dielectric layer (BDL) may be formed by an ALD process with precisely controlled layer thickness. An ALD process incorporating selected dopants with desired electrical performance and precisely controlled doping concentrations into the BDL material may then form a doped dielectric layer. A doped dielectric layer with BDL and doping layer formed using successively applied films is referred to herein as a Laminate Dielectric Layer (LDL). A doped dielectric layer with BDL and dopant formed using an alternating base/dopant pulsing technique is referred to herein as an Alloy Dielectric Layer (ADL). A doped dielectric layer with BDL and dopant formed using a co-deposition process is referred to herein as a Co-deposit Dielectric Layer (CDL). A leakage blocking layer (LBL) may likewise be formed by an ALD process with precisely controlled layer thickness.

A composite dielectric structure produced in accordance with the present invention provides a high-k doped dielectric material with desired electrical properties, including but not limited to:

A higher dielectric constant value than that of $HfO_2$ or $ZrO_2$ alone;

An equivalent or lower leakage current than that of $HfO_2$ or $ZrO_2$ alone;

An equivalent or increased breakdown voltage than that of $HfO_2$ or $ZrO_2$ alone; and An equivalent or improved step coverage than that of $HfO_2$ or $ZrO_2$ alone.

Figure 2:
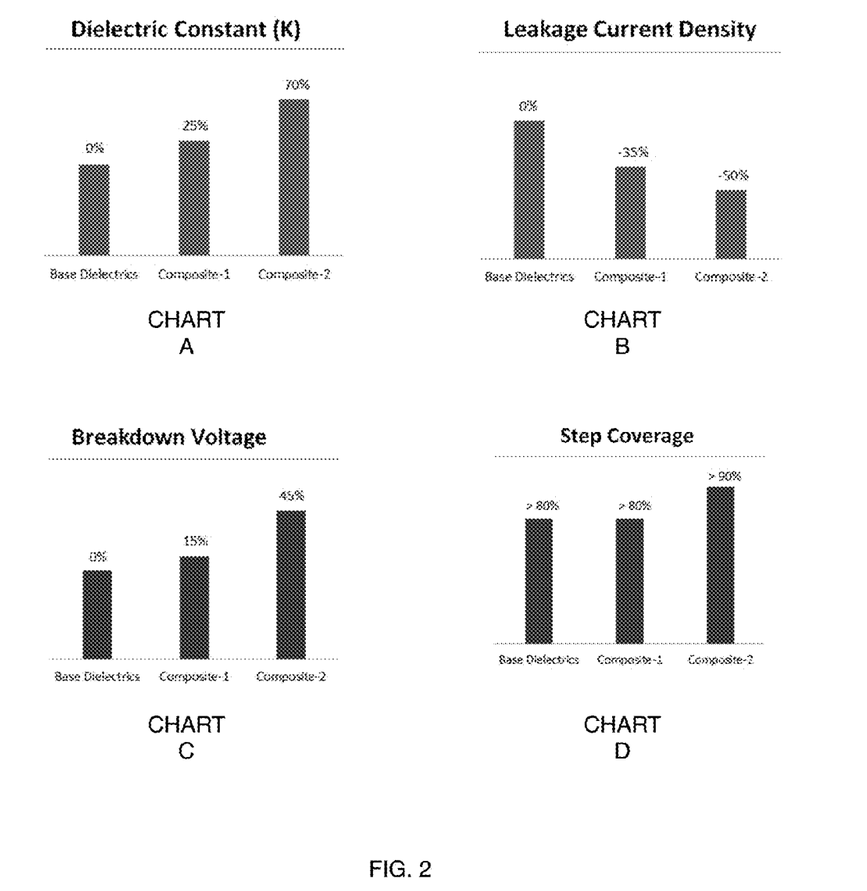

A composite dielectric structure made with an optimal design of LDL/ADL/CDL and LBL stacks promotes formation of tetragonal and cubic polymorphs that have higher dielectric constants at typical semiconductor processing temperatures. Post process annealing from 300° C. to 900° C. can further increase the dielectric constant. The charts shown in FIG. 2 provide examples of improved electrical performance with some designs of composite dielectric structures produced in accordance with the present invention annealed at temperatures between 300° C. and 900° C.

As shown in Chart A, dielectric constant increases of 10-100% can be achieved with the present composite dielectric structures, in contrast with base dielectric materials, such as $ZrO_2$ and $HfO_2$. As shown in Chart B, leakage current density reduction of as much as 50% can be accomplished with composite dielectric structures configured in accordance with the present invention, in comparison to base dielectric materials, such as $ZrO_2$ and $HfO_2$. As shown in Chart C, breakdown voltage ($V_{bd}$) enhancement of as much as 70% can be obtained with composite dielectric structures configured in accordance with the present invention, in comparison to base dielectric materials, such as $ZrO_2$ and $HfO_2$. As shown in Chart D, step coverage of more than 80% remains possible with a composite dielectric structure configured in accordance with the present invention.

Figure 3:
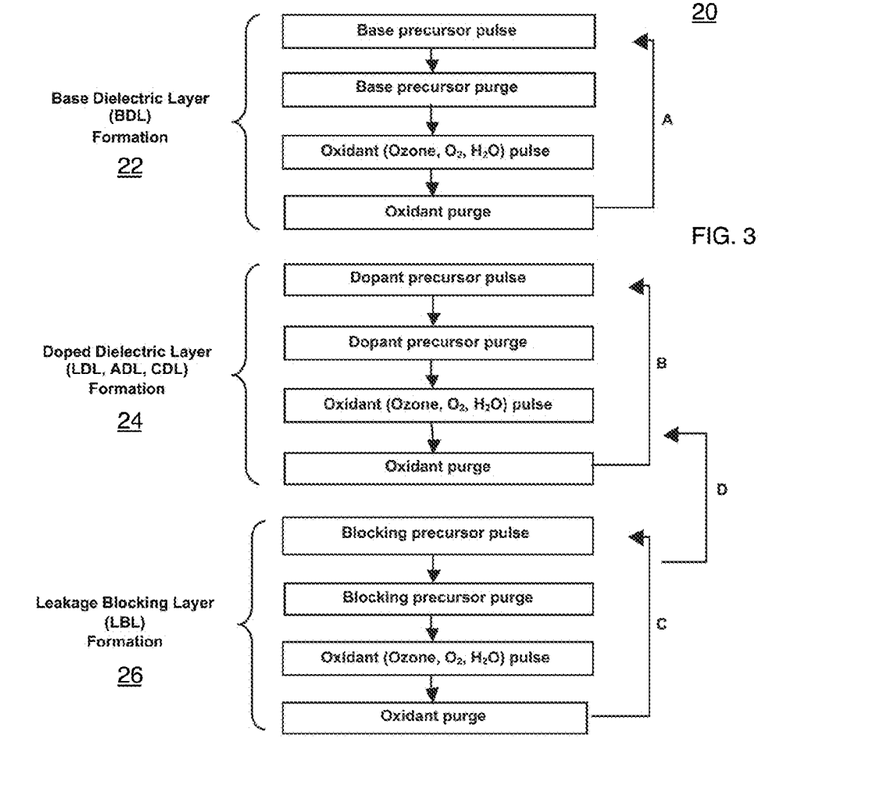
FIG. 3 illustrates an example of a process 20 for fabricating a composite dielectric structure in accordance with an embodiment of the present invention.

FIG. 3 illustrates an example of a process 20 for fabricating a composite dielectric structure in accordance with an embodiment of the present invention; in particular an ALD process for forming a base dielectric layer (BDL), a doped dielectric layer (LDL/ADL/CDL) using laminate, alloying and co-deposit schemes, and a leakage blocking layer (LBL). As indicated above, fabricating a composite dielectric structure is accomplished by formation of the desired stacks using various laminate, alloying or co-deposit strategies. The optimal design of LDL/ADL/CDL and LBL stacks produces the desired electrical performance. Process 20 thus includes sequential sub-processes for formation of a base dielectric layer (BDL) using BDL formation process 22, a doped dielectric layer (LDL, ADL, CDL) using a doped dielectric layer formation process 24, and a leakage blocking layer (LBL) using a leakage blocking layer formation process 26.

BDL formation process 22 includes repetition of a base precursor pulse, followed by a base precursor purge, and an oxidant (e.g., Ozone, $O_2$, $H_2O$) pulse, followed by a purge of the oxidant. Doped dielectric formation process 24 includes a dopant precursor pulse, followed by a dopant precursor purge, and an oxidant (e.g., Ozone, $O_2$, $H_2O$) pulse, followed by a purge of the oxidant. LBL formation process 26 includes a blocking precursor pulse, followed by a blocking precursor purge, and an oxidant (e.g., Ozone, $O_2$, $H_2O$) pulse, followed by a purge of the oxidant. As illustrated in FIG. 3, the formation of composite dielectric stacks is achieved by successively depositing (e.g., as represented by loop D) doped dielectric layers (e.g., as represented by loop B) and leakage blocking layers (e.g., as represented by loop C). The numbers of ALD process cycles for base dielectric layer (A), doped dielectric layer (B), and leakage blocking layer (C) are dependent on the desired doping concentration, stack thickness, and electrical performance requirements for a composite dielectric structure. Optimal process repeatability can be achieved by accurate base dielectric thickness control, accurate dopant concentration and thickness control, and accurate blocking oxide thickness control. Process performance can be optimized through the use of desired process deposition rates, required process thickness uniformity within substrates, required process defect limitations, and preferred high process throughput.

Figure 4:
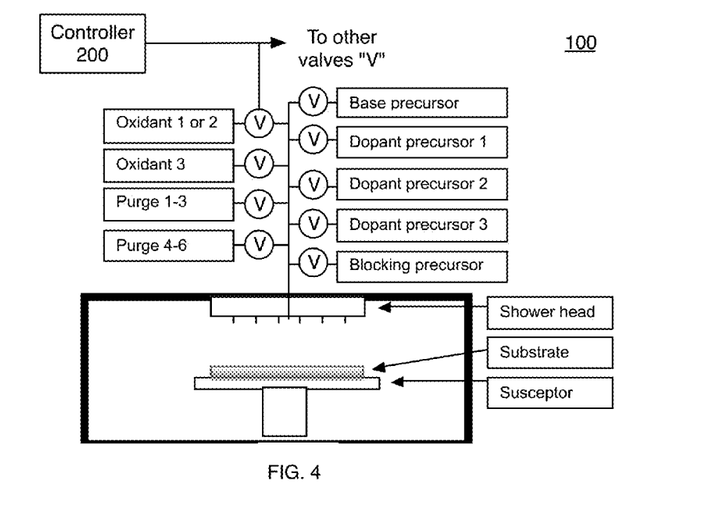
FIG. 4 illustrates one example of an atomic layer deposition (ALD) apparatus for fabricating a composite dielectric structure in accordance with embodiments of the invention.

The present invention further concerns an atomic layer deposition (ALD) apparatus for fabricating a composite dielectric structure. FIG. 4 illustrates one example of such an ALD system 100 for fabricating BDL, LDL, ADL, CDL, and LBL materials. This configuration includes multiple precursor delivery lines, multiple oxidant delivery lines, multiple inert gas purging lines, a gas dispersion showerhead, and a heated susceptor for a substrate. As illustrated, the delivery of base precursors, dopant precursors, blocking precursors, oxidants and purge gasses is controlled by a controller 200 through the operation of valves (V) or other flow control devices within the delivery lines. As described in greater detail below, controller 200 may be a processor-based controller storing processor-executable instructions for performing the ALD processes discussed above with respect to FIG. 3. An alternative ALD system 150, as in FIG. 5, has one precursor vapour delivery system connected to multiple showerheads with corresponding susceptors.

Figure 5:
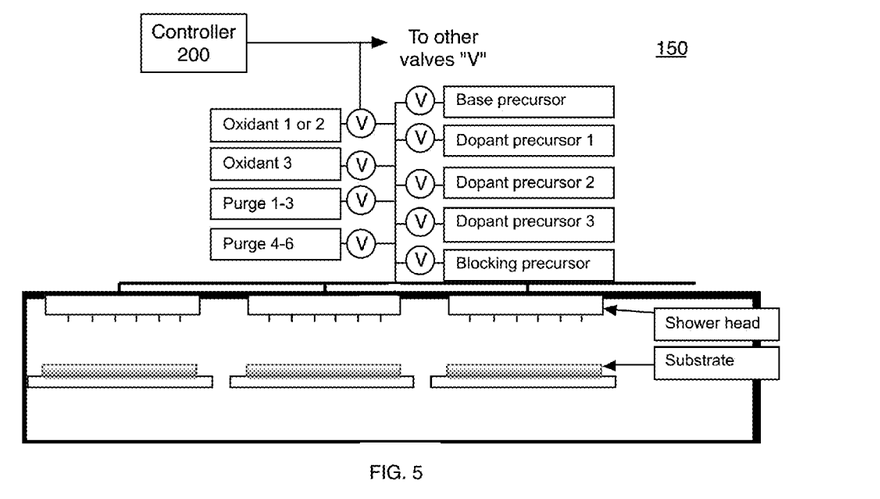
FIG. 5 illustrates an alternative ALD system to that shown in FIG. 4.

As shown in the illustrations, some embodiments of the ALD apparatus provide for delivery of up to five different precursors for fabricating a large combination of doped materials. Up to three different dopants can be incorporated into the BDL during the fabrication of desired composite dielectric structures, and precursors can be either liquids or solids dissolved in proper solvents. The ALD apparatus may also provide for delivery of up to three different oxidants for a variety of materials process and property optimization. In some embodiments, the process chamber volume is adjustable, allowing for higher partial pressure and higher precursor dose concentration control during ALD process than would be the case if the volume were fixed. Preferably, showerheads having a nozzle pattern that provides even distribution of precursor, oxidant and purge gas flows are used. A heated susceptor for heating a substrate provides stable control at typical semiconductor processing temperatures.

As indicated above, one or more of the methods or processes described herein may be executable using various computer-based devices (e.g., controller 200). Such devices may include any electronic device capable of performing the actions described above (using suitable programming) and, where applicable, processing the information for display so as to properly convey the information. In such devices, a processor may control the overall functions of the electronic device such as running applications and controlling peripherals (such as valves, mass flow controllers, and similar devices). The processor may use short-term memory to store operating instructions and to help in the execution of the operating instructions (e.g., such as the temporary storage of calculations and the like). The processor may also use non-transitory storage to store and read instructions, files, and other data that requires long term, non-volatile storage.

Figure 6:
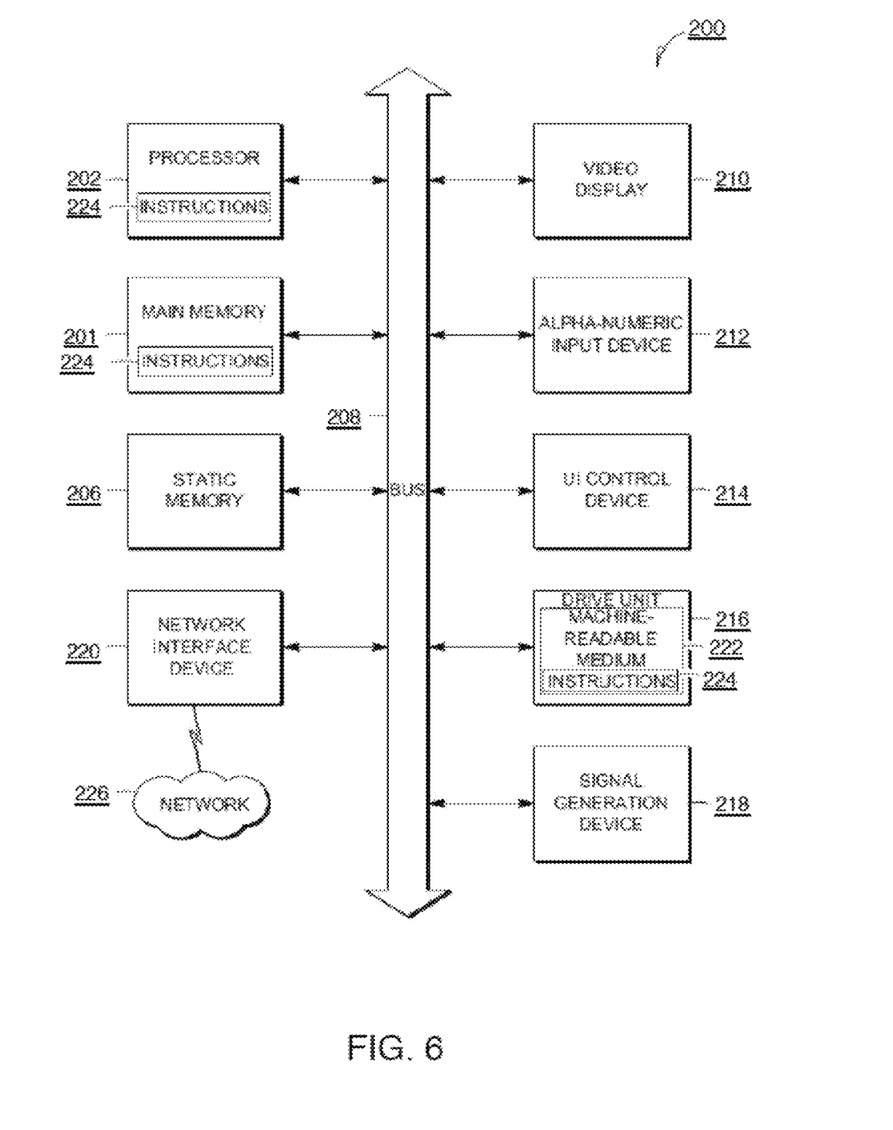
FIG. 6 illustrates one example of a processor-based controller suitable for use with an ALD apparatus configured in accordance with the present invention.

FIG. 6 illustrates one example of a processor-based controller 200 suitable for use with an ALD apparatus configured in accordance with the present invention. Controller 200 includes main memory 201 and processor 202 communicatively coupled to one another over a bus 208 or other communication mechanism for communicating information. Main memory 201 may be any form of memory, such as a random access memory (RAM) or other dynamic storage device, for storing information and instructions 224 to be executed by processor 202. Main memory 201 also may be used for storing temporary variables or other intermediate information during execution of instructions to be executed by processor 202. Controller 200 further includes a read only memory (ROM) or other static storage device 206 coupled to the bus 208 for storing static information and instructions for the processor 202. A storage device 216, having a machine readable storage medium (such as a hard disk) 222, is provided and coupled to the bus 208 for storing information and instructions 224.

Controller 200 may also include a display 210, for displaying information to a user. An input device 212, including alphanumeric and other keys, is coupled to the bus 208 for communicating information and command selections to the processor 202. Another type of user input device is cursor controller 214, such as a mouse, a trackball, etc., for use in communicating information and command selections to processor 202 and for controlling cursor movement on the display 210, especially where a graphical user interface is used.

According to one embodiment of the invention, processor 202 executes sequences of instructions contained in main memory 201. Such instructions may be read into main memory 201 from another computer-readable medium, such as storage device 216. Execution of the sequences of instructions contained in the main memory 201 causes the processor 202 to perform the process steps described above to effect the various ALD deposition sequences. In alternative embodiments, hard-wired circuitry may be used in place of or in combination with computer software instructions to implement the invention. Thus, embodiments of the invention are not limited to any specific combination of hardware circuitry and software.

Controller 200 may also include a communication interface 220 coupled to the bus 208. Communication interface 220 provides a two-way data communication channel for controller 200 via a network 226. Further, a signal generation device such as an alarm or buzzer may be included to signal alert or other conditions.

Thus, in one embodiment the present invention provides a composite dielectric structure containing LDL, ADL, and/or CDL, as well as LBL layers, in which the LDL/ADL/CDL layers can have similar or different thickness, in which the thickness ranges from 0.1 nm-100 nm, and doping concentrations in each process loop (X or Y in FIG. 1). A dopant or doping layer can be incorporated into the BDL at any thickness from 0.5-200 nm and doping concentration ranges from 0.5-50% may be used. The doped layers can be formed by any one or more of LDL/ADL/CDL techniques in each process loop.

In the example illustrated in FIG. 1, LDL/ADL/CDL layer (2) is a central dielectric layer, having the most significant impact on the dielectric constant value of the composite dielectric structure. The number of LDL/ADL/CDL layer (1) and LBL (b) loops (e.g., X loops) are selected to modulate the leakage current while still maintaining the dielectric constant for the structure. The number of LDL/ADL/CDL layer (3) and LBL (c) loops (e.g., Y loops) are selected to modulate the leakage current while still maintaining the dielectric constant for the structure. LBL (a), (b), (c) and (d) can have the same or different thicknesses, in which the thickness ranges from 0.1-100 nm. LBL (b) and (c) can have the same or different thicknesses in each X or Y loop, and LBL (a) and (d) can have the same or different thicknesses.

The present composite dielectric structure may include base dielectric materials, dopants and leakage blocking materials, in which the base dielectric materials include $ZrO_2$, $HfO_2$, and any composite of $ZrO_2/HfO_2$ mixtures. Dopants may include lanthanide metals; group III(B), IV(B) and V(B) metals; as well as oxides of such metals. Leakage blocking materials may include $SiO_2$ and $Al_2O_3$.

In some embodiments, the present composite dielectric structure may include doped dielectric layers (LDL, ADL and CDL), in which an LDL is formed by incorporating a doping layer into a base dielectric layer (BDL) using a laminate method, an ADL is formed by incorporating a dopant into a BDL using an alloying method, and a CDL is formed by pulsing a base material and a dopant together using a co-deposit method.

In further embodiments, a composite dielectric structure may include doped dielectric layers (e.g., LDL/ADL/CDL (1), (2) and (3) in FIG. 1), in which a single doping method (such as LDL, ADL or CDL) can be used throughout the entire structure; any combination of two or three doping methods (such as LDL+ADL, or LDL+CDL, or LDL+ADL+CDL) can be applied in each of the X and/or Y loops; and/or combined doping methods may be the same or different in each X and/or Y loop.

In yet other embodiments of the invention, a composite dielectric structure can be symmetric or asymmetric with respect to a central layer thereof, such as LDL/ADL/CDL layer (2) in FIG. 1, in which: the number of X loops of LDL/ADL/CDL (1) and LBL (b) layers can be from 0 to 500; the number of Y loops of LDL/ADL/CDL (3) and LBL (c) layers can be from 0 to 500; the number of X and Y loops can be the same or different; and/or the number of LBL (a) and (d) layers can be the same or different.

ALD processes for fabricating composite dielectric structures containing BDL, LDL, ADL, CDL and LBL materials in accordance with embodiments of the present invention may include the combination (see loop D of FIG. 3) of doped dielectric depositions (B) (including LDL, ADL or CDL process) and leakage blocking depositions (C). The combined processes (D) may be designed to form films with desired doping concentrations, stack thicknesses, and electrical performances. BDL thickness may be controlled by the number of cycles of base dielectric process (A). Doped layer (LDL, ADL, and CDL) thickness may be controlled by the number of cycles of doped dielectric process (B). LBL thickness may be controlled by the number of cycles of leakage blocking process (C). In each ALD process cycle, metal pulse time and flow (for base, doping and blocking precursors) are controllable. In each ALD process cycle, oxidant pulse time and flow (for Ozone, $O_2$, and $H_2O$) are controllable. The deposition temperatures for forming these materials during ALD process may be between 100° C.-500° C., inclusive. A post-deposition processing step to "anneal" the stack for achieving targeted film properties may be used.

In one example of an ALD process flow for fabricating an oxide BDL, a base metal precursor is pulsed into a chamber of an ALD apparatus with an Argon (or other neutral) carrier gas. After a self-limiting deposition process of base metal precursor on the substrate surface is complete, excess base metal precursor is purged out and an oxidant (Ozone, $O_2$ or $H_2O$) is pulsed into the chamber. Finally, the oxidant is purged out. These steps may be repeated until a desired BDL thickness is obtained.

In one example of an ALD process flow for fabricating a doped dielectric LDL, a doping layer is incorporated into a base dielectric layer (BDL) using a laminating method. The thickness ratio of the doping layer and the BDL ranges from 0 to 50% to obtain the desired doping concentration. The laminating sequence of the doping layer into the BDL is selected to accomplish a desired doping layer with optimal electrical performance. The process sequence of the LDL formation includes pulsing a base metal precursor into a chamber of an ALD apparatus with an Argon (or other neutral) carrier gas. After a self-limiting deposition process of base metal precursor on the substrate surface is complete, excess base metal precursor is purged out and an oxidant (Ozone, $O_2$ or $H_2O$) is pulsed into the chamber. Then, the oxidant is purged out and a dopant precursor is pulsed into the chamber with an Argon (or other neutral) carrier gas. After a self-limiting deposition process of dopant precursor on the substrate surface is complete, excess dopant precursor is purged out, an oxidant (Ozone, $O_2$ or $H_2O$) is pulsed into the chamber, and then the oxidant is purged out of the chamber. These steps may be repeated until a desired LDL thickness is obtained.

In one example of an ALD process flow for fabricating a doped dielectric ADL, an ADL is formed by pulsing (once or multiple times) of a base metal followed by a dopant before the injection of oxidant into the chamber. The thickness ratio of the doped layer and the BDL ranges from 0 to 50% to obtain the desired doping concentration. Doping concentration can also be controlled by the amount of dopant injected during each ALD cycle. The alloying sequence of the dopant into the BDL is selected to accomplish a desired doping layer with optimal electrical performance. One such example of a process for ADL layer formation includes pulsing the base metal precursor into the chamber with Argon (or other neutral) carrier gas. After a self-limiting deposition process of base metal precursor on the substrate surface is complete, excess base metal precursor is purged out and dopant precursor is pulsed into the chamber with Argon (or other neutral) carrier gas. After deposition, the excess dopant precursor is purged out and oxidant (Ozone, $O_2$ or $H_2O$) is pulsed into the chamber. Finally, the oxidant is purged out of the chamber. These steps may be repeated to achieve a desired ADL thickness.

In one example of an ALD process flow for fabricating a doped dielectric CDL, a CDL is formed by injecting base metal and dopant simultaneously before the injection of oxidant into the chamber. Doping concentration may be controlled by varying the ratio of metal and dopant precursors used in the pulses. Doping concentration may also be controlled by the thickness ratio of the co-deposited layer and the BDL, ranging from 0-50%. The co-depositing sequence of the metal/dopant into the BDL is selected to accomplish a desired doping layer with optimal electrical performance. An example of a process sequence for CDL formation involves pulsing base metal and dopant precursors into a chamber together with Argon (or other neutral) carrier gas. After a self-limiting deposition processes of mixed base metal and dopant precursors on the substrate surface are complete, excess base metal and dopant precursors are purged out of the chamber and an oxidant (Ozone, $O_2$ or $H_2O$) is pulsed into the chamber. Finally, the oxidant is purged out of the chamber. These steps may be repeated to obtain a desired CDL thickness.

In one example of an ALD process flow for fabricating an oxide LBL, a leakage block precursor is pulsed into the chamber with Argon (or other) carrier gas. After a self-limiting deposition process of leakage blocking precursor on the substrate surface is complete, excess leakage blocking precursor is purged out and an oxidant (Ozone, $O_2$ or $H_2O$) is pulsed into the chamber. Finally, the oxidant is purged out of the chamber. These steps may be repeated to achieve a desired LBL thickness.

The composite dielectric structure of the present invention can be crystallographically stabilized in the tetragonal or/and cubic phases, which have higher dielectric constants upon post-process annealing. The structure can be annealed under inert gases, such as Argon, $N_2$ or forming gas $N_2/H_2$, or other environments. The structure can be annealed at temperatures between 300-900° C., inclusive. The structure can also be photo irradiated by infrared, visible, or ultraviolet light, and/or can be treated by electron and ion irradiation.

An apparatus suitable for fabricating a composite dielectric structure containing BDL, LDL, ADL, CDL and LBL materials using ALD techniques may include a precursor vapour delivery system (e.g., under the control of a suitably programmed processor-based controller) and a process chamber. The process chamber may include one or more identical reactor chambers, each reactor chamber having a showerhead and a susceptor (preferably heated) for supporting a substrate. A multi-reactor chamber may have multiple identical showerheads, susceptors, and process volumes. Each reactor may be isolated from the others by dynamic laminar inert gas flows to facilitate fast purging and short ALD cycle times. The laminar inert gas flows may be between 0.1 L to 10 L.

The precursor vapour delivery system is connected to the showerhead(s) as is an oxidant delivery system, but the gas delivery lines of the oxidant delivery system are separated from the precursor delivery lines. Various inert gas lines facilitate inert gas delivery for process gas purging, precursor vapour carriers, and reactor isolating gas flows.

In ALD systems such as those described above, a showerhead may have two separate gas flow paths, one for precursors and another for oxidants. The showerhead is preferably designed to provide evenly distributed precursors, oxidants, and inert gases. In some instances precursor vapour flow is adjustable to obtain the optimal deposition uniformity; for example, adjustable between approximately 0.1 to 10 L. Oxidant flow may also be adjustable between approximately 0.1 to 10 L to provide the optimal film quality. Showerhead temperatures are preferably controlled to be between 100-300° C., inclusive.

The susceptor is used to control the substrate process temperature needed for typical semiconductor devices between 100 and 600° C. In operation, a substrate is placed on the susceptor and the susceptor is moved vertically up and down to adjust the distance between the substrate and the showerhead.

In some embodiments, the precursor vapour delivery system can supply up to five different precursor sources, including base metals, dopants and leakage blocking precursors. Each precursor source can be operated independently of the others and each precursor source can be operated in synchronization with one or more other precursor sources (e.g., through programmatic control of controller 200). The abundant variety of precursor sources allow to pulse as many as three doping materials into the chamber at the same time for creating the LDL, ADL, and CDL materials and the combined stacks with desired electrical performance.

The ALD system may also include a precursor vaporizer for vapour delivery into the chamber. The vaporizer can effectively transform the liquid precursors or solid precursors dissolved in proper solvents to high concentration precursor vapours. The vaporizer is heated and the temperature can be adjusted (based on precursor's vapour pressure) between 100 to 300° C., inclusive. Vaporized precursor vapour is carried into the reactor via inert carrier gas, which flow is approximately between 0.1 L to 10 L, inclusive. Preferably, the vapour delivery line for transferring the precursor vapour to the chamber is also heated to be between 100 to 300° C., inclusive.

The oxidant delivery system is configured to permit oxidants, e.g., ozone in desired concentration or oxygen, to be delivered into the reactor through the showerhead. Ozone concentrations may be selected dependent on the requirements for the film properties and substrate tolerance, for example between 10 to 500 g/m$^3$. Ozone and oxygen flows may range from 0.1 to 50 L, inclusive. Oxidant, H$_2$O vapour at controlled temperature can also be delivered into the reactor through the showerhead. H$_2$O vapour temperature is preferably controlled to be between room temperature and 100° C., inclusive.

The ALD system also includes multiple inert gas lines. Inert gas is used for metal and oxidant purging during ALD process, to carry precursor vapours into the reactors, and for creating gas flow curtains around the reactors of a multi-reactor chamber for mutual isolation.

The foregoing description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. For example, the code can be stored on one or more non-transitory, or non-volatile tangible computer-readable media, and may be loaded into volatile media during execution or at other times (e.g., during a transfer between storage devices, etc.). Examples of these tangible computer-readable media can include, but are not limited to, hard disks, removable magnetic disks, removable optical disks (e.g., compact disks and digital video disks), magnetic cassettes, memory cards or sticks, read only memories (ROMs), flash memories or other solid state devices (SSDs) and the like.

What is claimed is:

1. A semiconductor device, comprising a substrate, and a composite dielectric structure formed on a surface of the substrate, the composite dielectric structure including one or more Leakage Blocking Layers (LBL) interleaved with at least two doped dielectric layers including a Laminate Dielectric Layer (LDL) and an Alloy Dielectric Layer (ADL), the ADL and a Co-deposit Dielectric Layers (CDL), or the LDL and the CDL, wherein each LDL, ADL, and CDL comprises dopants incorporated in a base dielectric layer (BDL).

2. The semiconductor device of claim 1, wherein each LDL, ADL, and CDL has a same or different thickness and doping concentration for each interleaved pair of LBL and LDL, ADL, or CDL, wherein doping concentration ranges from 0.5-50%.

3. The semiconductor device of claim 1, wherein the composite dielectric structure includes base dielectric materials, dopants and leakage blocking materials, in which the base dielectric materials include one or more of: $ZrO_2$, $HfO_2$, and composites of $ZrO_2/HfO_2$ mixtures.

4. The semiconductor device of claim 1, wherein the dopants include one or more of: lanthanide metals; group III(B), IV(B) and V(B) metals; and oxides of group III(B), IV(B) and V(B) metals.

5. The semiconductor device of claim 1, wherein leakage blocking materials of the composite dielectric structure include one or more of: $SiO_2$ and $Al_2O_3$.

6. A method of forming a composite dielectric structure on a surface of a substrate, the method comprising: forming one or more Leakage Blocking Layers (LBL) interleaved with one or more Laminate Dielectric Layers (LDL), Alloy Dielectric Layers (ADL), or Co-deposit Dielectric Layers (CDL), wherein:
    each LDL, ADL, and CDL comprises dopants incorporated in a respective base dielectric layer (BDL);
    LDLs are formed by incorporating a doping layer into a BDL using a laminate method;
    ADLs are formed by incorporating a dopant into a BDL using an alloying method;
    CDLs are formed by pulsing a BDL base material and a dopant together using a co-deposit method; and
    a combination of doping methods are used in forming the interleaved layers of the composite dielectric structure.

7. The method of forming a composite dielectric structure of claim 6, wherein different ones of the doping methods are used in forming alternating groups of the interleaved layers of the composite dielectric structure.

8. The method of forming a composite dielectric structure of claim 6, wherein the interleaved layers of the composite dielectric structure are symmetric with respect to a central LDL/ADL/CDL layer.

9. The method of forming a composite dielectric structure of claim 6, wherein the interleaved layers of the composite dielectric structure are asymmetric with respect to a central LDL/ADL/CDL layer.

10. An atomic layer deposition (ALD) process for fabricating a composite dielectric structure, comprising: forming a plurality of Leakage Blocking Layers (LBL) interleaved with one or more Laminate Dielectric Layers (LDL), Alloy Dielectric Layers (ADL), or Co-deposit Dielectric Layers (CDL), wherein each LDL, ADL, and CDL comprises dopants incorporated in a base dielectric layer (BDL), wherein a combination of doping methods are used in forming the interleaved layers of the composite dielectric structure.

11. The ALD process of claim 10, wherein each BDL is formed by:
  (a) pulsing a base metal precursor into a chamber with an Argon carrier gas, the chamber having therein a substrate on which the base metal precursor will be deposited;
  (b) after a self-limiting deposition of the base metal precursor a surface of the substrate is complete, purging excess base metal precursor from the chamber;
  (c) pulsing an oxidant into the chamber, wherein the oxidant comprises ozone, $O_2$ or $H_2O$;
  (d) purging the oxidant from the chamber; and
  (e) repeating steps (a) through (d), in sequence, until the BDL has reached a desired thickness.

12. The ALD process of claim 10 wherein each LDL is formed by:
  (a) pulsing a base metal precursor into a chamber with an Argon carrier gas, the chamber having therein a substrate on which the base metal precursor will be deposited;
  (b) after a self-limiting deposition of the base metal precursor on a surface of the substrate is complete, purging excess base metal precursor from the chamber;
  (c) pulsing an oxidant into the chamber, wherein the oxidant comprises ozone, $O_2$ or $H_2O$;
  (d) purging the oxidant from the chamber;
  (e) pulsing a dopant precursor into the chamber with an Argon carrier gas;
  (f) after a self-limiting deposition of dopant precursor on the base metal precursor is complete, purging excess dopant precursor from the chamber;
  (g) pulsing the oxidant into the chamber;
  (h) purging the oxidant from the chamber; and
  (i) repeating steps (a) through (h), in sequence, until the LDL has reached a desired thickness.

13. The ALD process of claim 10 wherein each ADL is formed by:
  (a) pulsing a base metal precursor into a chamber with an Argon carrier gas, the chamber having therein a substrate on which the base metal precursor will be deposited;
  (b) after a self-limiting deposition of the base metal precursor on a surface of the substrate is complete, purging excess base metal precursor from the chamber;
  (c) pulsing a dopant precursor into the chamber with an Argon carrier gas;
  (d) after a self-limiting deposition of dopant precursor on the base metal precursor is complete, purging excess dopant precursor from the chamber;
  (e) pulsing an oxidant into the chamber, wherein the oxidant comprises ozone, $O_2$ or $H_2O$;
  (f) purging the oxidant from the chamber; and
  (g) repeating steps (a) through (f), in sequence, until the ADL has reached a desired thickness.

14. The ALD process of claim 10 wherein each CDL is formed by:
  (a) pulsing a base metal precursor and a dopant precursor together into a chamber with an Argon carrier gas, the chamber having therein a substrate on which the precursors will be deposited;
  (b) after a self-limiting deposition of mixed base metal and dopant precursors on a surface of the substrate is complete, purging excess base metal and dopant precursor from the chamber;
  (c) pulsing an oxidant into the chamber, wherein the oxidant comprises ozone, $O_2$ or $H_2O$;
  (d) purging the oxidant from the chamber; and
  (e) repeating steps (a) through (d), in sequence; until the CDL has reached a desired thickness.

15. The ALD process of claim 10 wherein each LBL is formed by:
  (a) pulsing a leakage blocking precursor into a chamber with an Argon carrier gas, the chamber having therein a substrate on which the precursor will be deposited;
  (b) after a self-limiting deposition of leakage blocking precursor on a surface of the substrate is complete, purging excess leakage blocking precursor from the chamber;
  (c) pulsing an oxidant into the chamber, wherein the oxidant comprises ozone, $O_2$ or $H_2O$;
  (d) purging the oxidant from the chamber; and
  (e) repeating of steps (a) through (d), in sequence, until the LBL has reached a desired thickness.

16. The ALD process of claim 10 further comprising crystallographically stabilizing the composite dielectric structure through a post-process anneal, in which the anneal is performed in the presence of an inert gas, at a temperature of 300° C.-900° C.

17. The ALD process of claim 10 further comprising crystallographically stabilizing the composite dielectric structure through a post-process anneal, in which the composite dielectric structure is photo irradiated by infrared, visible, or ultraviolet light.

18. The ALD process of claim 10 further comprising crystallographically stabilizing the composite dielectric structure through a post-process anneal, in which the composite dielectric structure is treated by electron and ion irradiation.

* * * * *